June 3, 1969 A. BERENBAUM 3,447,387
TUNING MECHANISM
Filed Nov. 9, 1967

INVENTOR.
ARTHUR BERENBAUM
BY
Harry W. Hargis III
AGENT 3,447,387
TUNING MECHANISM
Arthur Berenbaum, Holland, Pa., assignor to Philco-Ford Corporation, Philadelphia, Pa., a corporation of Delaware
Filed Nov. 9, 1967, Ser. No. 681,826
Int. Cl. F16h *35/18*
U.S. Cl. 74—10.8 9 Claims

ABSTRACT OF THE DISCLOSURE

A presettable UHF tuning mechanism including twenty-four detented positions for the 70 UHF channels, and means operable automatically in each such position to select a desired one of the group of channels assigned to that position. The UHF tuner is driven by a detented tuner knob through a pair of meshed helical gears. Adjustable positioning means, presettable for each of the 24 detented positions, imparts limited axial movement to one helical gear relative to the other, with consequent fine rotary adjustment of the tuner to select the desired UHF channel of a detented group.

*Cross-reference to related application*

The present invention is concerned with improvements in tuning mechanism of the type disclosed and claimed in the copending application of Arthur Berenbaum and Rufus F. Shelby, Ser. No. 677,977, filed Oct. 25, 1967, and assigned to the assignee of the present invention.

*Background of the invention*

This invention relates to tuning mechanisms, and more particularly to improvements in presettable tuning mechanisms for electronic tuners. While of broader applicability, the invention has particular utility in the field of UHF tuners as used in television receivers.

In view of the ever-increasing number of UHF channels in use, it has become desirable to provide step or detented tuning of these channels, as is provided for the VHF channels. Inasmuch as it is now necessary to provide for 70 UHF channels on a single rotary tuner, the provision of detented tuning has presented problems. One solution has been to provide each of a lesser number of detented positions a group of several VHF channels, with means provided for selective fine tuning of the desired channel of a selected group. Since there generally exists need for only one channel of a group of several, fine tuning is an unnecessary nuisance. The answer has been to provide presettable fine tuning means for the UHF channels. Heretofore, such means have comprised intricate linkages that are both costly and difficult to manufacture. It is a general objective of this invention to provide improved mechanical drive and linkage means for the presettable fine tuning of a UHF tuner, which means is both inexpensive and easy to manufacture.

*Summary of the invention*

In achievement of the above general objective, the present invention contemplates, in a preferred embodiment thereof, detented presettable tuning mechanism comprising a first shaft, tuning means rotatable with said first shaft, a first helical gear on said first shaft and keyed for rotation with and for axial movement along said shaft, a second helical gear arranged to mesh with the first gear, a second shaft for manually rotating said second gear, wheel means driven with said second shaft and carrying circumferentially spaced, axially extending adjustable follower elements positioned for sequential engagement by a central portion of said first gear as the latter is moved axially of its shaft, and means for moving said first gear axially upon each rotation of said second shaft including cam and cam follower elements coupled with said second shaft. These elements are operable, upon initiation of rotation, to move said first gear axially out of engagement with said follower, and operable, upon cessation of rotation, to accommodate axial movement of said first gear into the recited engagement with said follower. In particular accordance with the invention, the last described axial movement of the first helical gear causes it to rotate in achievement of the present fine tuning rotation of the tuning condenser. It will be appreciated also that the preset tuning for a detented position is achieved while the mechanism is in such detented position merely by adjusting the axial position of the follower.

For a more complete understanding of the invention, reference is made to the following description taken in light of the accompanying drawing.

*Description of the preferred embodiment*

Figures 1, 2:
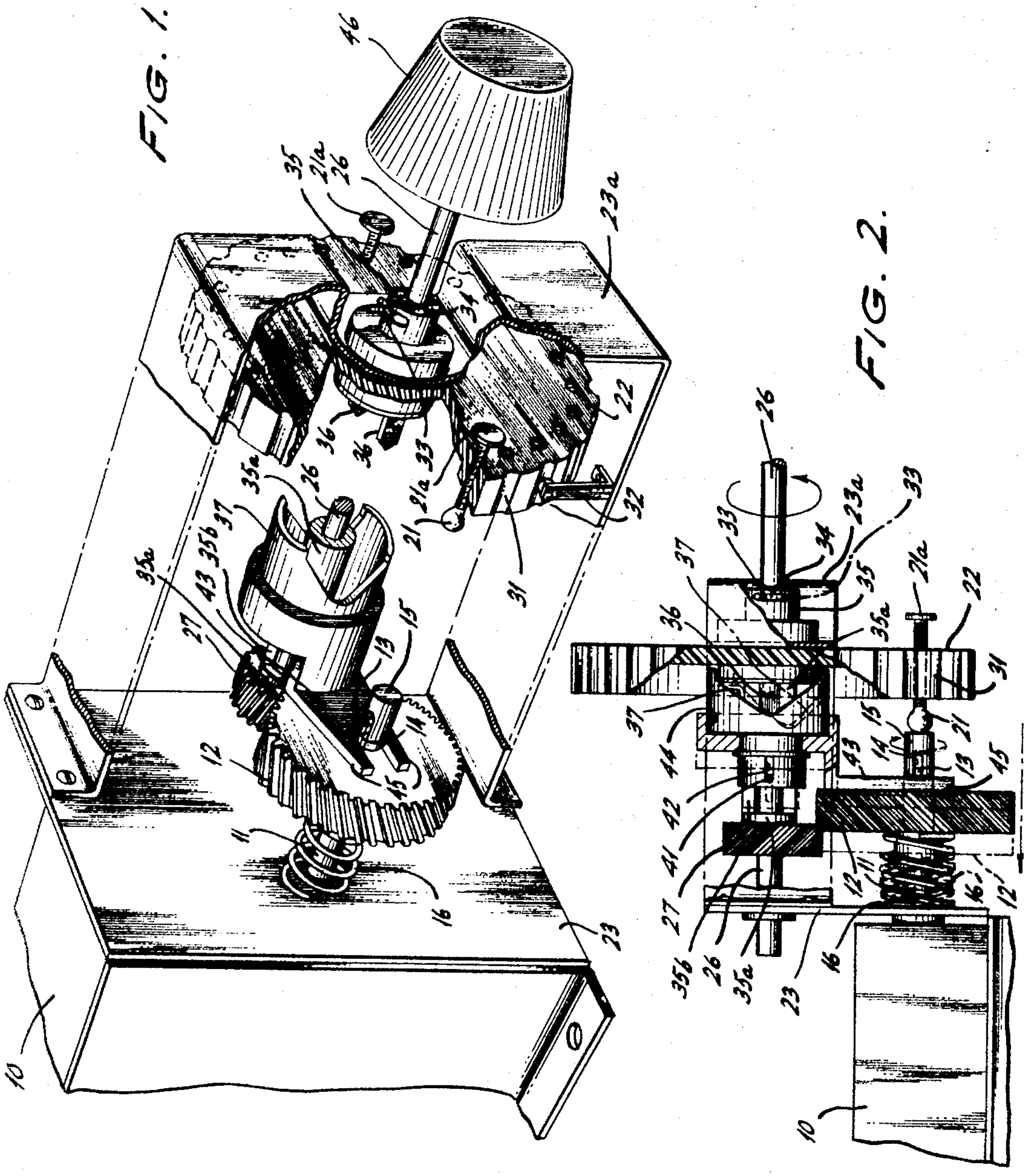
FIGURE 1 is an exploded view, in perspective and with parts broken away, of UHF tuning apparatus embodying the invention.
FIGURE 2 is a side view, with parts broken away, of apparatus shown in FIGURE 1, and illustrating operating features of the apparatus in broken lines.

With more detailed reference to FIGURES 1 and 2 of the drawing, a UHF tuner 10 of well known type is fixed to a bracket 23 and includes rotary tuning means, such for example, as infinitely variable condensers (not shown), carried by rotatable tuning shaft 11. A helical gear 12 is keyed for rotation with shaft 11 by engagement of a pin 13, extending through the shaft 11, with an axially extending slot 14 in a hub portion 15 of the gear. A coiled spring 16 reacts between a portion of bracket 23 and gear 12 to maintain the hub portion 15 of gear 12 in abutting engagement with one of a plurality of adjustable followers 21 on a wheel 22 (FIGURE 2). Bracket 23 is provided with a generally U-shaped portion **23*a* including bearing means for supporting a second rotatable shaft 26 on which wheel 22 is mounted by a hub portion 35. A helical gear 27 is keyed to a sleeve 35*a* that is an extension of hub portion 35, shaft 26, and which gear 27 is meshed with helical gear 12. The rim of wheel 22 has a detented periphery 31 engageable by a resiliently supported detent member 32 to provide a plurality of detented positions of the tuner shaft 11**, as will be more fully described below. While it has been found convenient to provide 24 detented positions, it will be understood that other numbers of positions may be provided.

Wheel 22 on shaft 26 is keyed thereto through a lost motion coupling comprising a pin 33 affixed to shaft 26 and slidable in a circumferentially extending slot 34 provided in hub portion 35 of the wheel. Since sleeve **35*a* is an extension of the hub 35, it is keyed to the shaft 26 by the same lost motion coupling. A pair of cam follower elements 36 carried by hub portion 35 are equally spaced from sleeve 35*a* and are presented in the direction of extension of the sleeve and shaft 26. A cylindrical cam element 37 is free to turn and slide on sleeve 35***a* and is shaped and disposed to mate with follower elements 36. The sleeve 35*a* is open on one side as seen at 35*b* (FIGURE 2) so that a transversely extending pin 41 carried by shaft 26 extends without interference through sleeve 35*a* and is received in a longitudinal slot 42 provided in hub portion 37*a* of cam element 37.

A retractor bracket 43 includes a recessed portion 44 (FIGURE 2) that receives a generally cylindrical section of cam element 37 and through which recessed portion extend shaft 26, sleeve 35*a* and the hub portion of the cam element. Bracket 43 also includes a prong portion 45 which straddles tuner shaft 11 and engages a face portion of helical gear 12. Gear 12 is held against the prong portion 45 by means of coil spring 16 concentric with shaft 11 and reacting, in compression, between bracket 23 and gear 12.

In operation, the knob 46 is grasped and rotated to turn shaft 26, for example in the direction of the rotational arrow applied thereto in FIGURE 2. This immediately rotates the cam element 37 relative to detented wheel 22 and cam followers 36, by virtue of the pin-and-slot connections 41–42, thereby axially shifting cam element 37 on sleeve 35*a* through the interaction of the cam element and the cam followers 36, the latter being held from turning by detent means 31, 32 acting on wheel 22. This moves gear 12, through the agency of retractor bracket 43, toward tuner 10 thereby moving the gear hub 15 away from the follower 21 on wheel 22. By the time this motion has taken place, the pin 33 in shaft 26 has reached the end of slot 34 in hub 35 of wheel 22 thereby initiating rotation of the wheel and sleeve 35*b*, the helical gears 12 and 27, and hence the tuner shaft 11. Continued rotation of knob 46 moves the wheel, together with the tuner shaft, sequentially through the undesired detented positions until the desired detented UHF channel is reached, and the knob release. As the knob is released, coil spring 16 urges the helical gear 12 to a position in which hub 15 is presented for engagement by the one of followers 21 aligned therewith. In being moved axially this short distance, gear 12, by virtue of its helical teeth, rotates a small amount relative to helical gear 27 which is held in the detented position of wheel 22 through sleeve 35*b* connected thereto. This small amount of relative rotation achieves the preset fine tuning operation. At the same time, cam element 37 is urged, through retractor bracket 43 to its original, seated position relative to its cam follower elements 36.

The 24 detented positions cover the UHF band comprising 70 channels. While there is provision for a follower 21 in correspondence with each of the detented positions, only two such followers have been illustrated for the sake of convenience. To all but two of the detented positions are allocated three channels, there being allocated two channels for each of the remaining two detented positions. Allocation of different numbers of channels to each detented position is of course contemplated by the invention. In the present embodiment, the detented positions are spaced 15° apart in provision of the 24 positions. A 2 to 1 gear ratio is provided so that the tuner shaft turns about 7.5° for each detented position to cover a bandpass of three channels (18 megacycles).

To preset the tuner in one of its preselected detented positions, the knurled head 21*a* of a follower 21 is rotated manually to position gear 12 axially of its shaft 11. This axial movement results in the required rotational movement of gear 12, hence tuner shaft 11, as its helical teeth slide along the helical teeth of gear 27 held stationary by detent means 31, 32. This operation is performed for each of the desired channels. After such presetting, all that is required to tune a channel is to turn the knob 46 until the preselected station is received. Tuning is therefore automatic, and suitable known indicator means may be used in combination with the tuner to identify the channel being received. Also, other known means may be used to position a follower 21 in achievement of preset fine tuning.

I claim:

1. Detented presettable tuning mechanism comprising first shaft means, tuning means rotatable with said first shaft means, first helical gear means on said first shaft means and keyed for rotation with and for axial movement along said shaft means, second helical gear means meshed with the first gear means, second shaft means for manually rotating said second gear means, wheel means driven with said second shaft means and carrying circumferentially spaced, axially extending adjustable follower elements positioned for engagement by a portion of said first gear means as the latter is moved axially of its shaft means, detent means for said wheel means, and means for moving said first gear means axially upon each rotation of said second shaft means and operable, upon initiation of rotation, to move said first gear means axially out of engagement with one of said follower elements, and operable, upon cessation of rotation of said second shaft means and second gear means, to move said first gear means into engagement with said follower element, with consequent additional rotational movement of said first gear means, said first shaft means and hence said tuning means.

2. Tuning mechanism according to claim 1, and characterized in that said means for moving said first gear means axially includes cam and cam follower means coupled for relative movements in response to rotation of said second shaft means, and linkage means operably interconnecting said first gear means and said cam means to provide the recited axial movement of said first gear means.

3. Tuning mechanism according to claim 2, and further characterized in that said cam follower means is rotatable with said wheel and is presented in the direction of extension of the axis of said second shaft means, and in that said cam means is of the cylindrical type, is coaxial with said second shaft means, and includes camming surfaces mating with said cam follower means whereby relative movement therebetween will cause them to move apart, said cam means further being keyed for rotation with said second shaft means and for sliding movements therealong, said linkage means including bracket means linking said cam means with said first gear means, and means for resiliently urging said cam follower and cam means toward one another.

4. Tuning mechanism according to claim 3 and further characterized in that said wheel means is coupled with said second shaft means through a lost motion linkage accommodating rotation of said cam means for a predetermined angular increment prior to rotation of said wheel means, as rotation of said second shaft means is initiated.

5. Tuning mechanism according to claim 3 and further characterized in that said means for resiliently urging said cam follower and said cam means comprises a helical spring in compression and reacting between said bracket means and fixed structure supporting said tuning means.

6. Detented fine tuning mechanism comprising a rotatable tuning shaft, first helical gear means keyed for rotation with and for axial movement along said shaft, second helical gear means meshed with said first gear means, means for establishing detented positions of said second gear means, means for imparting rotation to said second gear means, indexing means for engaging said first gear means to establish a different axial position thereof corresponding to each such detented position, and means for moving said second gear means axially to disengage it from said indexing means upon initiation of rotation of said second gear means, said last recited means for moving further being operable to cause said first gear means to move axially to engage said indexing means upon cessation of rotation of said second gear means, whereby said first gear means slides and rotates relative to said second gear means and achieves fine tuning rotation of said tuning shaft.

7. Tuning mechanism according to claim 6, and characterized in that said indexing means is adjustable in any one of the indexed positions of said tuning shaft.

8. Tuning mechanism according to claim 7, and further characterized in that said indexing means comprises a wheel driven with said second gear means, and circumferentially spaced, axially adjustable followers carried by said wheel and presented for abutting engagement by said first gear means.

9. Tuning mechanism according to claim 8, and further characterized in that said means for detenting comprises slots in the periphery of said wheel corresponding with positions of said tuning shaft, and means in resilient frictional engagement with said slots.

References Cited

UNITED STATES PATENTS 3,188,871 6/1965 Mentzer -------------- 74—10

MILTON KAUFMAN, *Primary Examiner.*

U.S. Cl. X.R.

74—10.6